United States Patent [19]

Dodson et al.

[11] 4,333,233

[45] Jun. 8, 1982

[54] MACHINES AND METHOD APPLICABLE TO THE MANUFACTURE OF ELECTRICAL AND LIKE DEVICES

[75] Inventors: Peter J. Dodson, Cheshunt; Kenneth E. Horwood, Basildon, both of England

[73] Assignee: Guardall Limited, Enfield, England

[21] Appl. No.: 122,895

[22] Filed: Feb. 19, 1980

[30] Foreign Application Priority Data

Feb. 19, 1979 [GB] United Kingdom ............... 7905697

[51] Int. Cl.³ ........................... H05K 3/32; B23P 3/32
[52] U.S. Cl. ..................................... 29/845; 29/739; 29/747; 29/842
[58] Field of Search .............. 29/747, 748, 751, 739, 29/842, 845, 718; 227/100, 101, 102, 103, 109, 112, 116, 135; 221/95, 116, 266, 264, 278

[56] References Cited

U.S. PATENT DOCUMENTS

| | | | |
|---|---|---|---|
| 3,216,097 | 11/1965 | Stricker et al. | 29/747 X |
| 3,765,075 | 10/1973 | Olney, Jr. et al. | 227/104 X |
| 3,963,456 | 6/1976 | Tsuchiya et al. | 221/264 X |

*Primary Examiner*—Francis S. Husar
*Assistant Examiner*—Carl J. Arbes
*Attorney, Agent, or Firm*—Pollock, Vande Sande & Priddy

[57] ABSTRACT

A machine for inserting terminal pins into a printed-circuit board under programmed control has a pin-insertion head which is charged with pins from a reciprocating shuttle that executes only one stroke in response to each pin-insertion operation. The head is charged with a pin from one of two passages in the shuttle at the end of each stroke while the other passage is being loaded with a pin ready for translation to the head to recharge it, during the next stroke. The machine further includes apparatus for feeding the pins from a pin storage means to the shuttle.

13 Claims, 10 Drawing Figures

MACHINES AND METHOD APPLICABLE TO THE MANUFACTURE OF ELECTRICAL AND LIKE DEVICES

This invention relates to machines and methods applicable to the manufacture of electrical and like devices.

The invention is particularly, though not exclusively, concerned with machines for inserting terminal pins into printed-circuit boards. With one common form of machine of this kind pins are inserted in individual boards under operator control, the operator actuating the machine for insertion of each pin into the board. More particularly, the operator is required to position the board accurately beneath an insertion-head of the machine to locate the head where a pin is to be inserted, and then to actuate the machine to bring about the pin-insertion operation. Terminal pins are supplied to the pin-insertion head one at a time via a shuttle device. The shuttle device has two strokes that are both executed during each pin-insertion operation of the machine, the shuttle in one stroke being loaded with a pin from the pin feed and in the other translating the pin to charge the pin-insertion head.

Problems, and in particular jamming of the shuttle, are experienced with the pin-feed to the insertion-head of the known machine. Furthermore the requirement from the operator to position the board accurately and to actuate the machine for insertion of each pin is wasteful of the operator's time and effort and readily leads to errors. The operator's task is especially tedious where a large number of pins are to be inserted in a large number of boards, and whereas fully automatic machines that insert all the pins required for a board at the same time in one insertion operation, are available, they are expensive to the extent that they cannot be justified economically unless a very large continuous production run of identical printed-circuit boards is involved. There are many circumstances where such large and continuous production runs are not applicable and the present invention has for one of its general objects improvement of the simpler and less-expensive kind of machine.

It is another of the general objects of the present invention to overcome problems in pin and other component feed in component-insertion machines. More especially it is one of the objects of this invention to provide for reduction in the likelihood of shuttle jamming in such machines. Also it is one of the objects of the invention to facilitate the turning of pins through a substantial angle without blocking, in the feed system of a pin-insertion machine.

The invention also has for another of its general objects the provision of a machine of relatively simple and inexpensive construction that may be utilized to automate the task of inserting a large number of pins or other components into printed-circuit boards. More especially it is an object of the present invention to provide a machine that is capable of accurate positioning of a board and insertion of terminal pins or other components, in accordance with programmed instructions.

According to one aspect of the present invention there is provided a method and a machine for inserting components into a board, in which a component-insertion head and the board are brought into contact one with the other where a said component is to be inserted, a component that charges the head being driven from the head into the board and the head being then re-charged from a reciprocating shuttle with another said component ready for the next insertion operation. With the improved method and machine of this invention only one of the two strokes of the reciprocal movement of the shuttle is executed in respect of each insertion operation, a said component being loaded into the shuttle at the end of each stroke for translation by the shuttle to the head so as to re-charge the head, during the next stroke.

Where the method and machine are applied to pin insertion the shuttle may have first and second pin-receiving passages that are loaded with individual pins when the shuttle is in first and second positions at opposite extremities respectively of its reciprocal movement. The pin-receiving passages will be spaced from one another each as to align the first passage with the pin-insertion head when the shuttle is in its said second position, and to align the second passage with the head when the shuttle is in its said first position so that the head is charged with a pin from one or the other of the two pin-loaded passages according to whether the shuttle is in its said first or second position. The shuttle is in these circumstances moved in opposite directions between its first and second positions in response to successive pin-insertion operations of the head so as to re-charge the head from the first and second passages in turn.

According to another aspect of the invention there is provided a pin-insertion machine that comprises a pin-insertion head, pin-feed means for applying pins in turn to the head, and means operable to drive the pin from the head for insertion therefrom into a board or other body, wherein the pin-feed means includes a chamber for turning pins supplied nose-to-tail from a first pin-feed passage, through a substantial angle into a second pin-feed passage. The chamber has a base wall that is substantially aligned with the first pin-feed passage so that each pin entering the chamber slides along the base wall with the leading end of the pin moving progressively further into the chamber from that passage. The leading end of the pin is lifted up from the base wall, for example by a jet of air discharged through a vent in that wall, when the trailing end of the pin has entered the chamber. The second pin-feed passage opens through the base wall adjacent the opening from the first passage, to receive the trailing end of the lifted pin so that this pin enters the second passage and blocks progress into the chamber of its next following pin from the first passage, until it has passed fully from the chamber.

According to a further aspect of the present invention there is provided a method and a machine for inserting components into a printed-circuit board wherein the board is moved automatically relative to a component-insertion head to locate the head successively at different positions of the board in accordance with execution of an ordered sequence of instructions, each such instruction including coordinates of demanded board-position with respect to the head and an operation command. Execution of each of at least some of the instructions of the sequence comprises the steps of determining coordinates of the actual position of the board with respect to the head, comparing the coordinates of actual position and of demanded position with one another to determine the difference therebetween, moving the board to reduce the said difference towards zero, responding to the operation command when the said difference has been reduced to zero to operate said head to insert a component into the board, and responding to insertion of a component into the board to proceed to execution of the next instruction of the sequence. Some of the instructions may include a jump operation-command, and in respect of each such instruction operation of the head is omitted so that the response to the condition in which the difference between the actual and demanded positions has been reduced to zero is in this case to proceed directly to execution of the next instruction; use of such jump commands is advantageous in those circumstances where it is necessary to introduce detours into movement of the board with respect to the insertion head, between one position of insertion and the next.

A method and machine for inserting terminal pins into printed-circuit boards, in accordance with the present invention, will now be described, by way of example, with reference to the accompanying drawings, in which.

Figure 1:
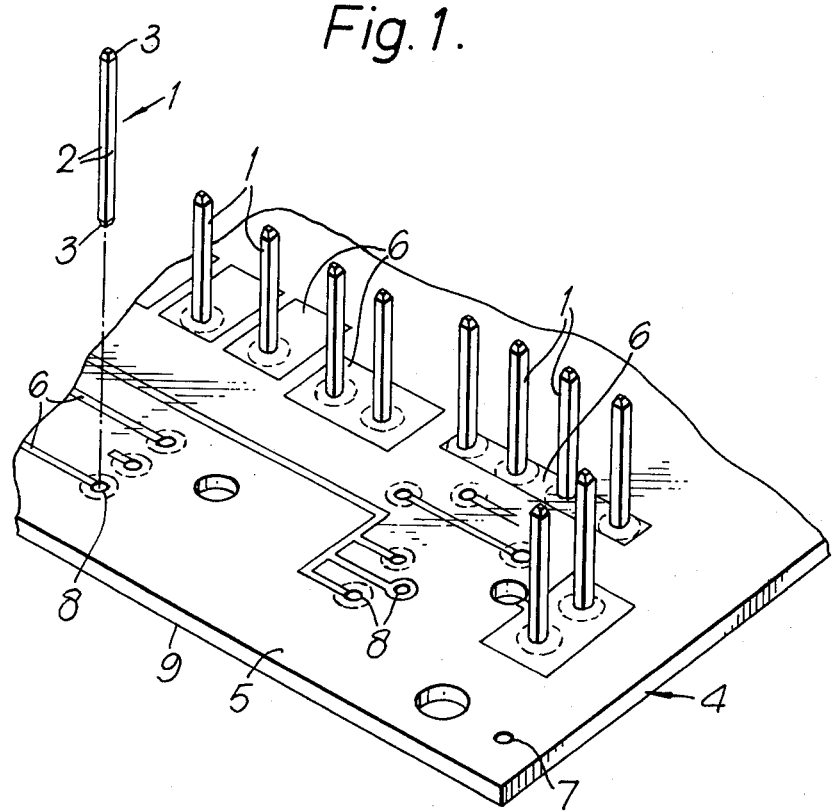
FIG. 1 is a perspective view of part of a printed-circuit board during insertion of terminal pins therein.

The machine and method to be described are concerned with the insertion of terminal pins as illustrated in FIG. 1, into printed-circuit boards. Referring to FIG. 1, each metal pin 1 is of square cross-section with flat longitudinal faces 2 and chambered ends 3, and having an overall length and thickness of typically 16 mm and 1 mm respectively. A multiplicity of pins 1 are inserted in each printed-circuit board 4 at spaced positions across its top surface 5 where connections for components and additional wiring are to be made to printed-circuit tracks 6 of the board 4. The board 4 has a hole 7 at one corner that together with a corresponding hole 7 at an adjacent corner (not shown), is used in the earlier stages of manufacture to establish a datum for the laying down of the tracks 6 on the board 4 and the piercing of the board 4 with circular holes 8 within the tracks 6 where the pins 1 are to be inserted; the holes 8 are plated-through after piercing so as to ensure electrical connection of the pins 1 with the tracks 6. The pins 1 are driven into the holes 8 by the machine so that each protrudes only slightly from the bottom surface 9 of the board 4. The fact that each pin 1 is of rectangular cross-section serves to enhance its retention within the board 4 and its electrical connection with the relevant track 6.

Figure 2:
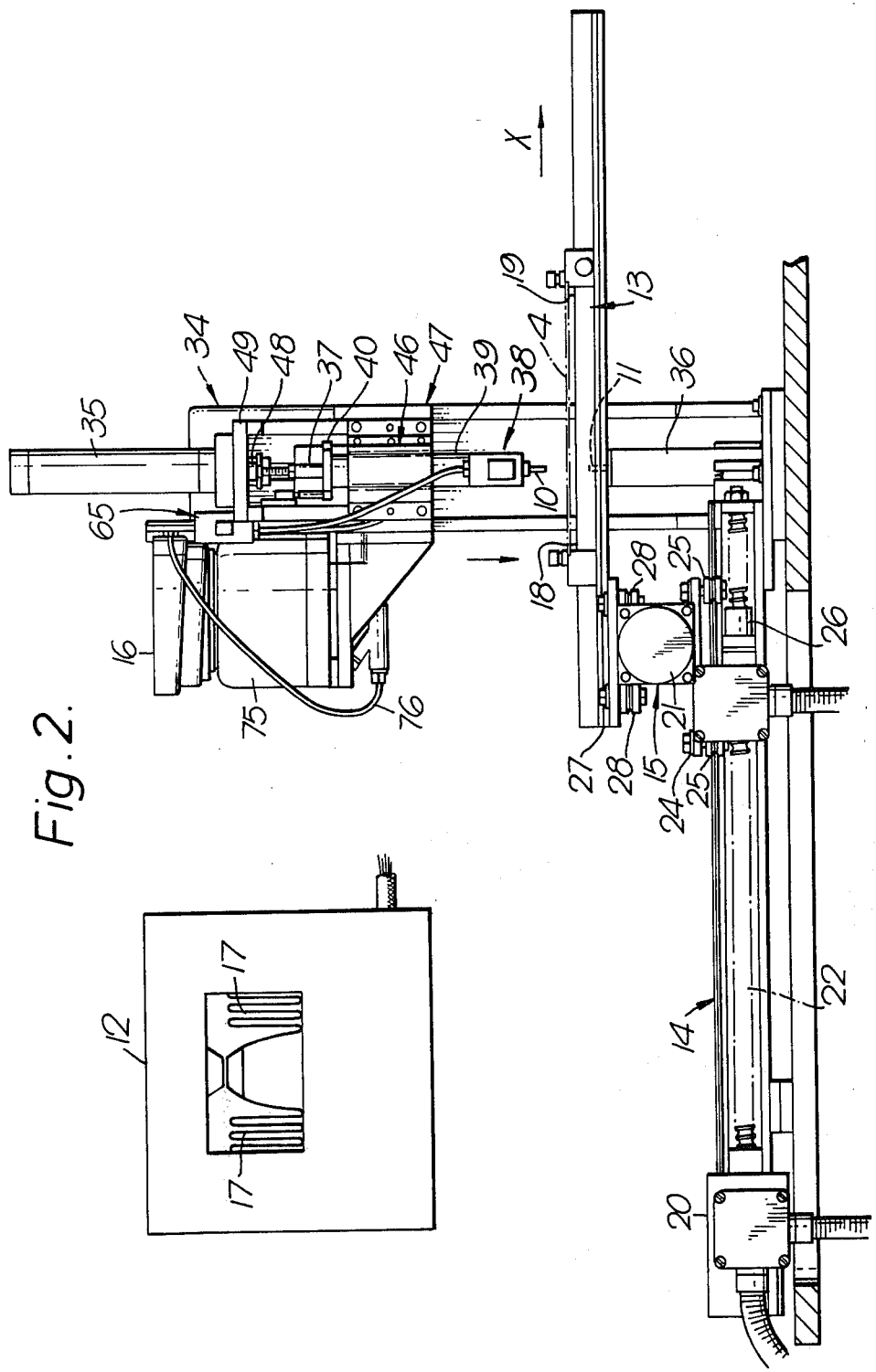
FIGS. 2 and 3 are respectively a front elevation and a plan of the pin-insertion machine.
Figure 3:
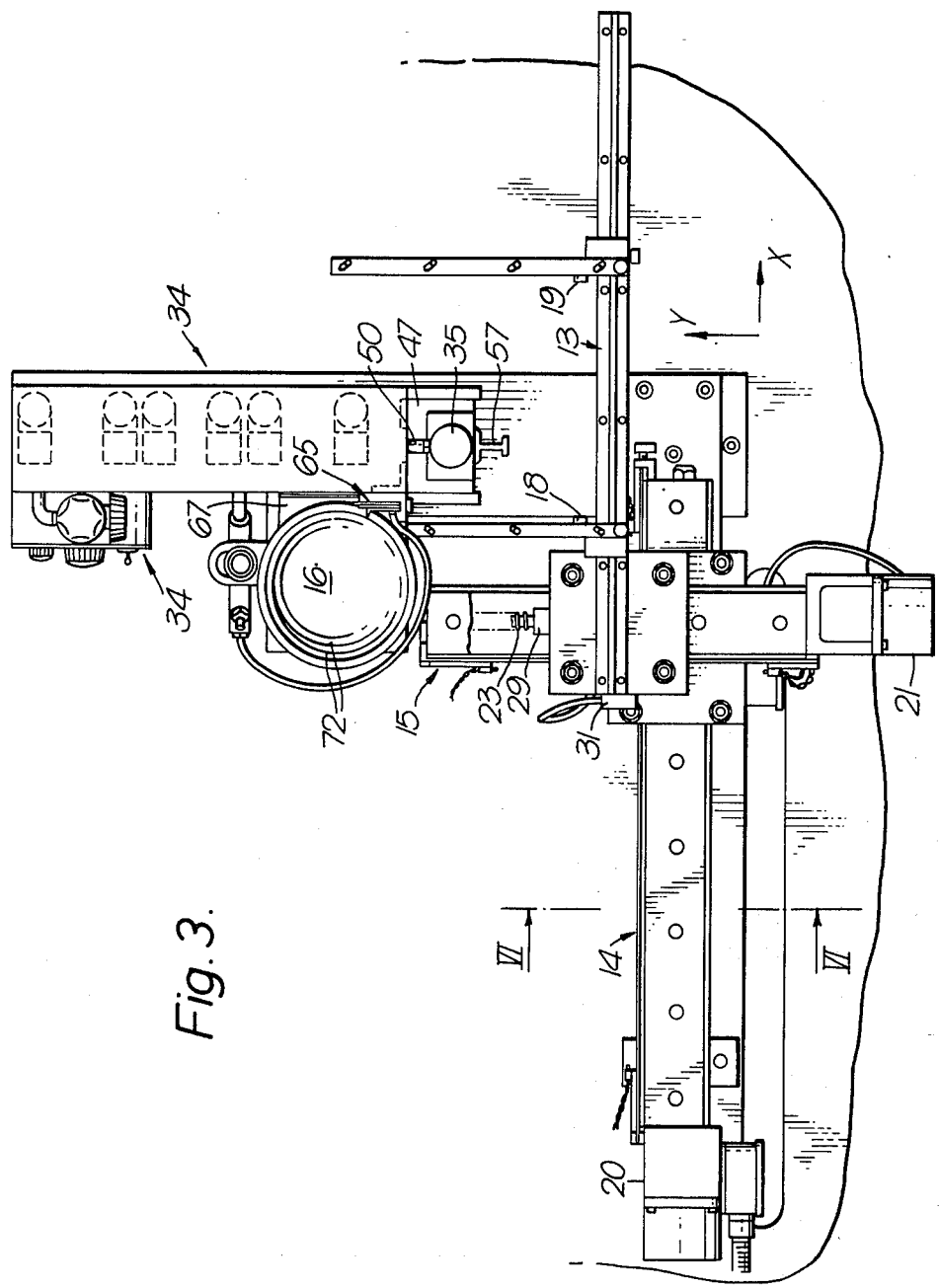
Figure 4:
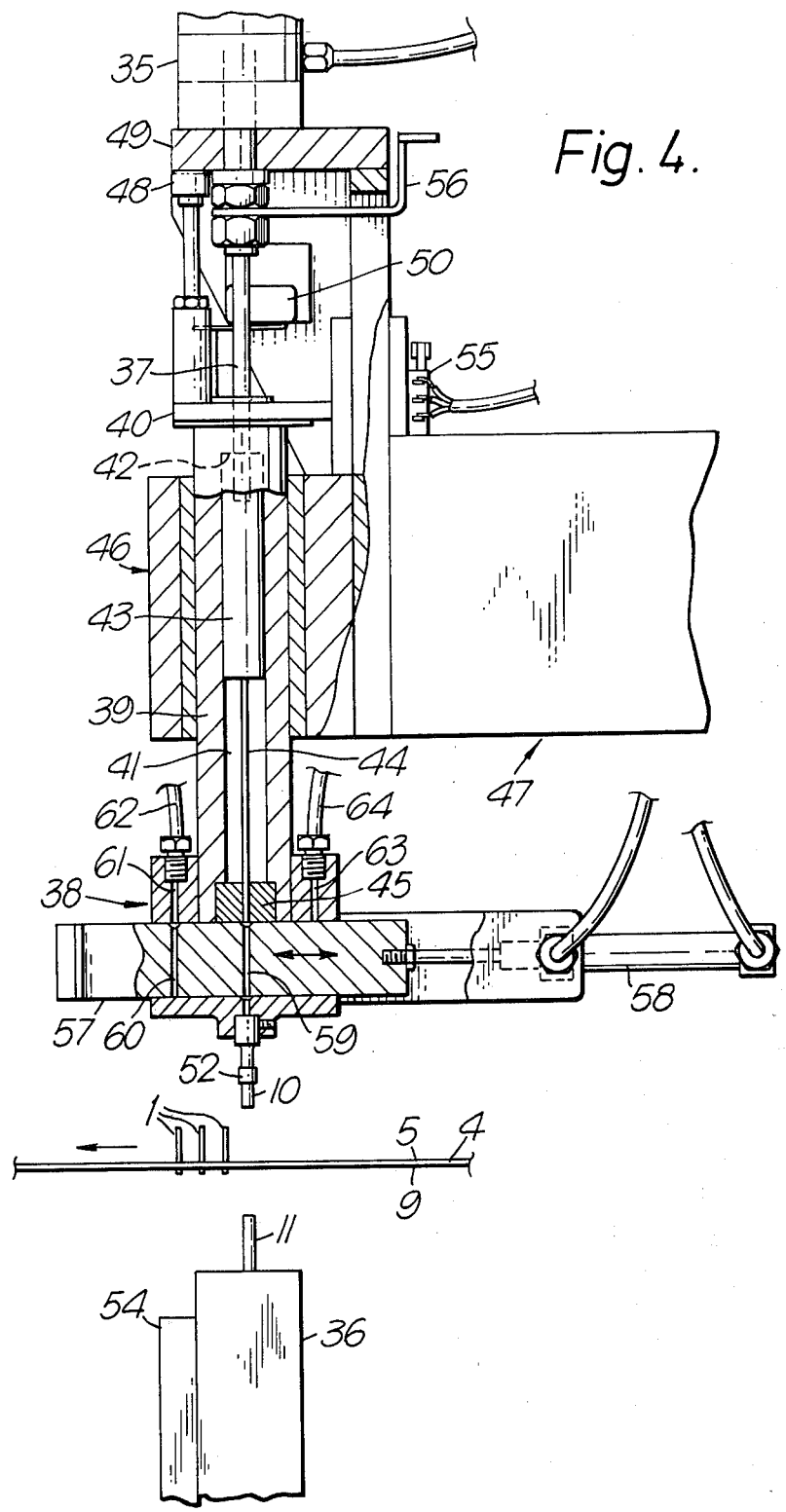
FIGS. 4 and 5 are side elevations of the pin-insertion machine illustrating successive stages of operation.
Figure 5:
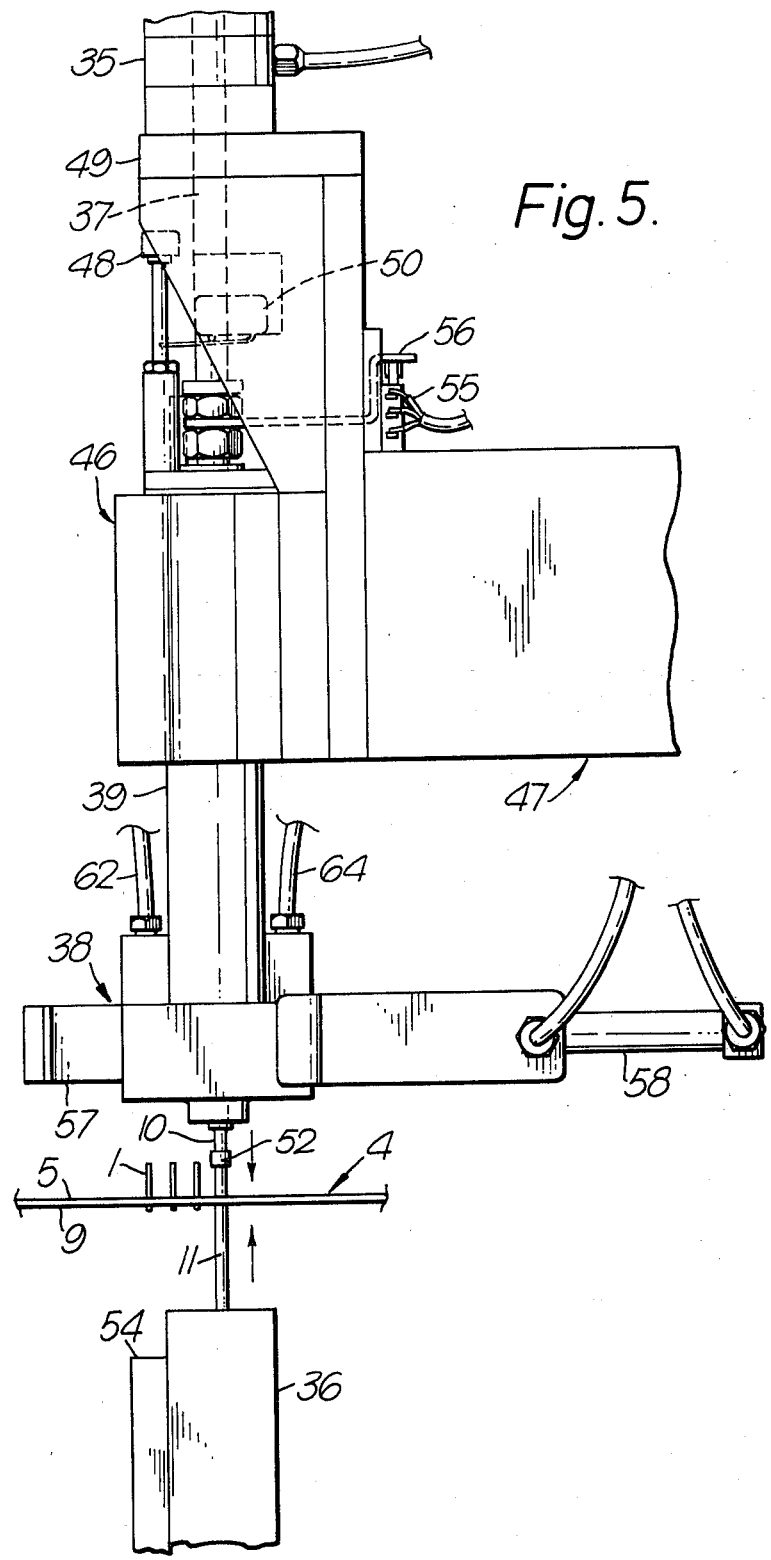
Figure 9:
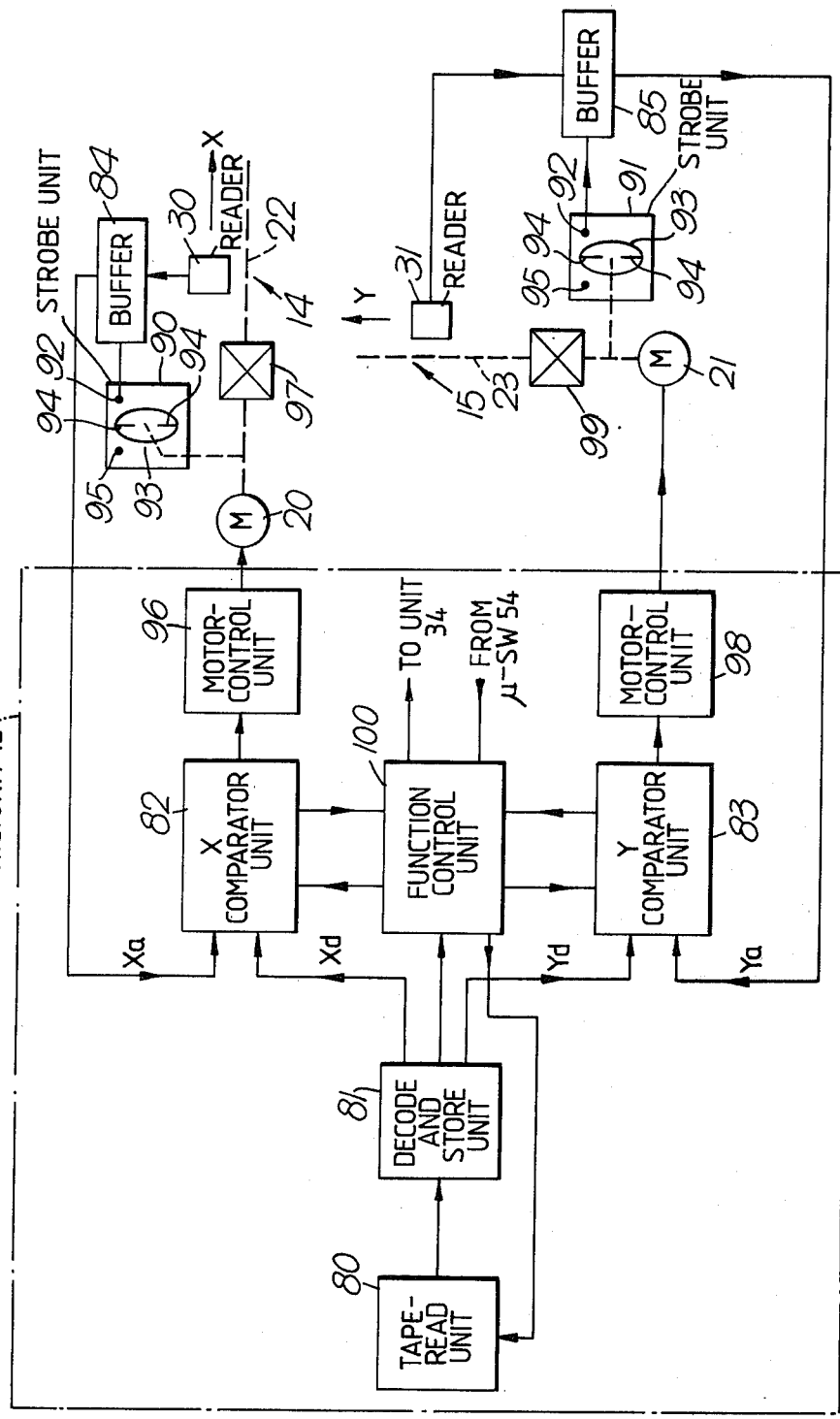
FIG. 9 is a block schematic representation of the electrical control system of the pin-insertion machine.

Referring more especially to FIGS. 2 and 3, the machine has a pin-insertion head 10 located vertically over an anvil 11 and operates automatically under control of a numerical-control unit 12 (FIGS. 2 and 9). A carriage 13 for carrying the printed-circuit board 4 in the machine is mounted on mutually-perpendicular slides 14 and 15 to move in X and Y coordinates respectively beneath the head 10, and is driven in these coordinates under program-control from the unit 12 to locate the holes 8 of the board 4 successively in register with the head 10 and anvil 11. When the carriage 13 is each time correctly positioned with one of the holes 8 in register with the head 10, force which holds the head 10 clear of the path of the carriage 13 as illustrated in FIGS. 2 and 4, is released. This allows the head 10 to fall under gravity onto the top surface 5 of the board 4, and the anvil 11 is at the same time driven upwardly to close upon the bottom surface 9; the resultant condition is as illustrated in FIG. 5. A pin 1 supplied from a hopper 16 of the machine and already at this time loaded in the head 10, is then driven from the head 10 into the hole 8 against the anvil 11. The anvil 11 is then retracted and the head 10 lifted and re-charged with another pin 1 while the carriage 13 is re-positioned to bring the next hole 8 in register with the head 10.

Correct positioning of the carriage 13 and actuation of the machine to insert a terminal pin is achieved in accordance with punched tape 17 loaded into the unit 12. The tape 17 is programmed in accordance with the layout of the terminal pins required for the board and the optimum sequence of their insertion. The printed-circuit board 4 is loaded on the carriage 13 and clamped in place with its two datum-defining holes 7 engaged on pins 18 and 19 that are aligned with one another on the carriage 13 parallel to the X-coordinate slide 14. The tracks 6, and more particularly the holes 8 for receiving the pins 1, are thereby appropriately established in the X-Y coordinate system of the machine. Each carriage-positioning instruction is programmed in the form of the X and Y coordinates of the pin 18 required to position the relevant hole 8 in register with the head 10 for execution of the related pin-insertion instruction programmed on the tape 17.

Figure 6:
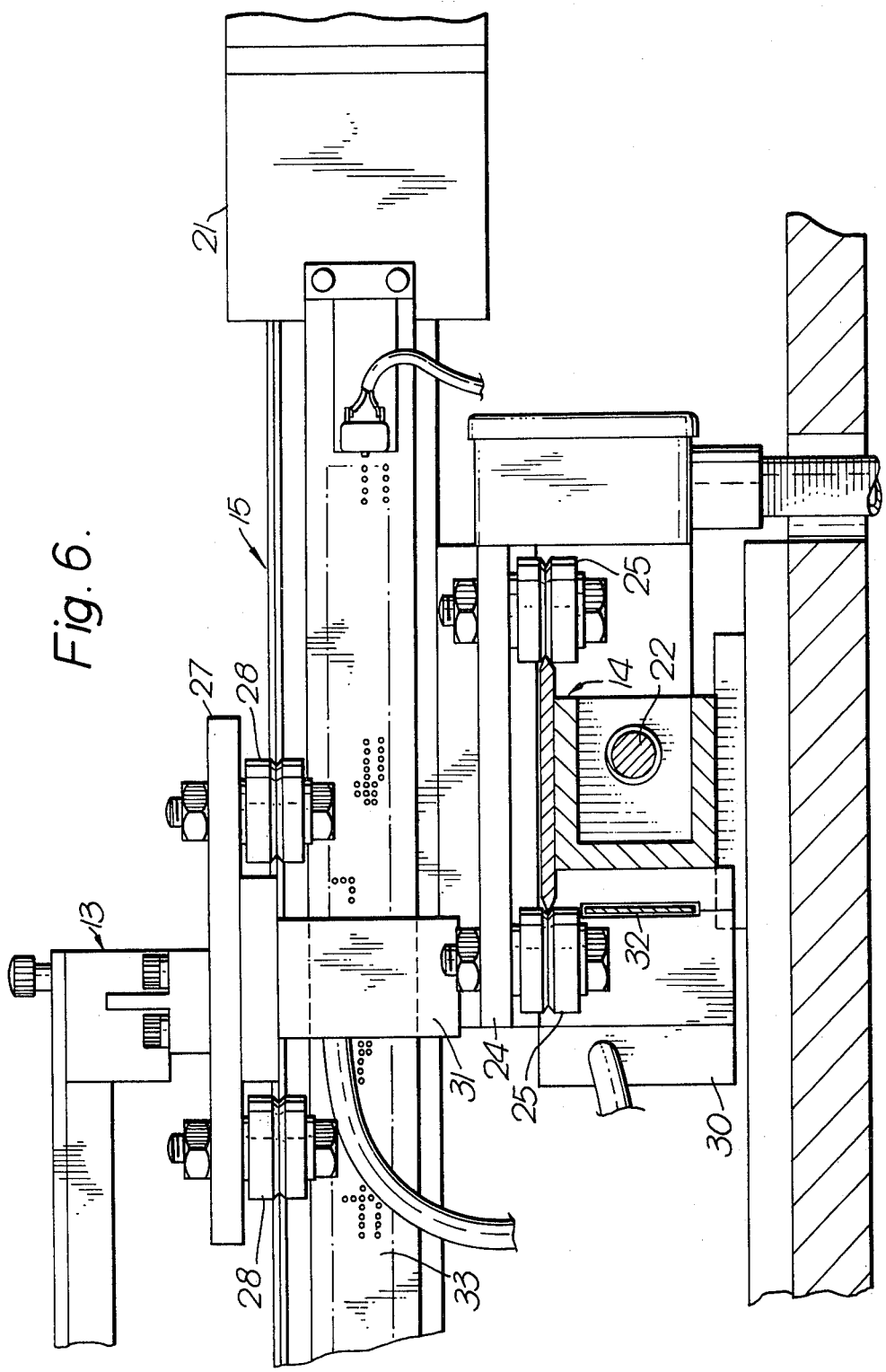
FIG. 6 is an enlarged sectional view of part of the pin-insertion machine, the section being taken on the line VI—VI of FIG. 3.

The programmed control unit 12 supplies electrical pulses for controlling the X and Y displacements of the carriage 13, to electrical stepping motors 20 and 21. The motor 20 rotates a lead-screw 22 of the slide 14, whereas the motor 21 rotates a lead-screw 23 of the slide 15. The slide 15 (as illustrated, to enlarged scale, also in FIG. 6) is carried by a saddle 24 which is mounted on the slide 14 by wheels 25 and which is coupled to a nut 26 (FIG. 2) on the lead-screw 22 so that the slide 15 is displaced in the X-coordinate direction in accordance with drive of the motor 20. The carriage 13 is similarly carried by a saddle 27 that is mounted by wheels 28 on the slide 15 and is coupled to a nut 29 (FIG. 3) on the lead-screw 23, so that the carriage 13 is displaced in X- and Y-coordinates in accordance with the drives of the two motors 20 and 21 respectively.

The X and Y coordinates appropriate to the actual position of the carriage 13 are read out by photoelectric sensor units 30 and 31, the sensor unit 30 being carried by the saddle 24 to read out the X-coordinate from a code-plate 32 that extends lengthwise of the slide 14, and the unit 31 being carried by the saddle 27 to read out the Y-coordinate from a code-plate 33 that extends lengthwise of the slide 15. The signals read out are compared in the unit 12 with signal representations of the desired, programmed X and Y coordinates derived from the tape 17, and the motors 20 and 21 are both energized from the unit 12 in the appropriate senses to reduce any differences between the compared pairs of signals to zero. When the comparison indicates that the correct, programmed positioning of the carriage 13 has been achieved, a command signal is issued by the unit 12 to a pneumatic control unit 34 of the machine, instructing insertion of a pin.

Pneumatic valves (indicated in broken outline only, in FIG. 3) within the control unit 34 regulate application of air pressure to pneumatic actuators 35 and 36 coupled to the head 10 and anvil 11 respectively, in a sequence appropriate to achieve closing of the head 10 and anvil 11 onto the board 4, insertion of the relevant pin 1, and then withdrawal of the head 10 and anvil 11 ready for re-positioning of the board 4. The actuator 36 is double-acting, being powered to close the anvil 11 onto the bottom surface 9 of the board 4 and hold it there, in response to the pin-insertion command signal and until the pin has been inserted. The actuator 35 is also double-acting and is normally powered in its reverse sense to hold the head 10 lifted up out of the path of the carriage 13. Pneumatic power to the actuator 35 is released in response to the pin-insertion command signal from the unit 12, this allowing the head 10 to fall freely onto the top surface 5 of the board 4.

The pin-insertion head 10 is part of an assembly (best seen in FIG. 4) that is coupled to the piston-rod 37 of the actuator 35, and projects downwardly from a shuttle mechanism 38 carried at the lower end of a vertically-mounted hollow shaft 39. The rod 37 extends freely through a plate 40 secured to the upper end of the shaft 39, into a bore 41 of the shaft 39 that terminates at the upper end in an annular shoulder 42. Within the bore 41 the rod 37 is coupled to the cylindrical head 43 of a downwardly-extending pin-driving rod 44. The head 43 is a sliding fit within the bore 41 and aligns the rod 44 appropriately with a guide 45 at the lower end ready for passage through the shuttle mechanism 38 into the head 10 when insertion of a terminal pin is to be effected. However while the actuator 35 is powered in its reverse sense to hold the head 10 clear of the board 4 as illustrated in FIG. 4, the rod 37 is urged upwardly to hold the pin-driving rod 44 withdrawn from the shuttle mechanism 38 and with its cylindrical head 43 abutting hard upon the shoulder 42 of the shaft 39. The shaft 39 is slidable vertically within its mounting 46 on the machine frame 47, and is drawn upwardly with the rod 37 by the abutment of the upwardly-drawn head 43 upon the shoulder 42. The extent of upward movement of the shaft 39, and accordingly of the whole pin-insertion assembly including the head 10, is limited by abutment of a stop 48 carried by the plate 40, with a bracket 49 of the frame 47.

When the pin-insertion command signal is received from the unit 12 and pneumatic power to the actuator 35 is in consequence released, the weight of the pin-insertion assembly draws the rod 37 downwardly. More particularly, the shaft 39 carrying the shuttle mechanism 38 and head 10, slides downwardly drawing the rods 37 and 44 with it under the abutment of the shoulder 42 with the head 43. The downward movement is arrested with the head 10 in contact with the upper surface 5 of the board 4, by abutment of the plate 40 with the mounting 46. An electrical microswitch 50 mounted on the frame 47 is actuated from the plate 40 during the final part of closing of the head 10 onto the surface 5, and this triggers the control unit 34 to power the actuator 35 in its forward sense for pin insertion.

Figure 7:
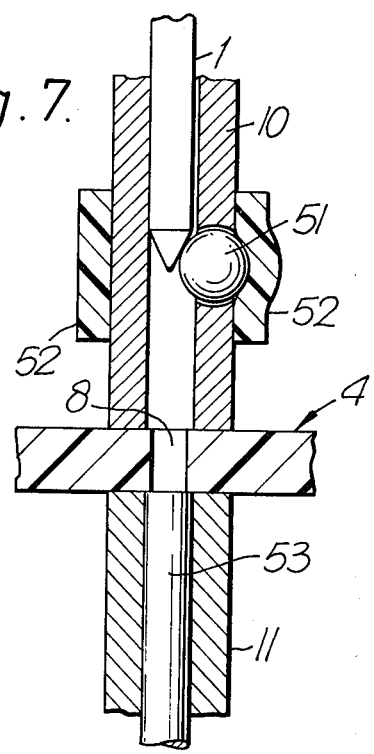
FIG. 7 is an enlarged sectional view of a pin-insertion head and cooperating anvil of the pin-insertion machine.

Powering of the actuator 35 in the forward sense drives the rod 37 downwardly to break abutment between the head 43 and the should 42, and to push the rod 44 down through the shuttle mechanism 38 onto the pin 1 already loaded as illustrated in FIG. 7, in the head 10. As shown in FIG. 7, the pin 1 is retained in the head 10 against a small steel ball 51 that is held captive by a rubber sleeve 52 encircling the head 10. Downward drive of the rod 44 onto the pin 1 forces the pin past the resiliently-loaded ball 51 and into the aligned hole 8 of the board 4. The extent to which the ball 51 can be deflected against the elastic restraint of the sleeve 52 is only sufficient to allow passsage of the pin if it is oriented squarely to the ball, that is to say such that one or other of its four longitudinal flat faces 2 runs against the ball 51; the drive applied by the rod 44 ensures that any necessary reorientation of the pin 1 to achieve this 'squareness' takes place through the initial impact of the lowermost chamfered-end 3 of the pin 1 on the ball 51 itself. Thus the pin 1 is inserted in the board 4 with an orientation, determined by the orientation of the ball 51 in the machine, that is uniform from one pin to the next inserted in the board 4 from the head 10.

The depth of insertion of the pin 1 in the board 4 is determined by the stroke of the rod 37, the lowermost end of the pin 1 projecting from the bottom surface 9 of the board 4 and depressing a plunger 53 (FIG. 7) within the anvil 11. The anvil 11 is at this time held closed upon the surface 9 by the actuator 36, and depression of the plunger 53 operates an electrical microswitch 54 (FIGS. 4 and 5) to signal to the unit 12 that a pin has been inserted. An electrical microswitch 55 on the mounting 46 is also operated by an arm 56 carried with the rod 37 when the rod 37 reaches the end of its pin-insertion stroke. Operation of the microswitch 55 is signalled to the pneumatic control unit 34 to power the actuator 36 for withdrawal of the anvil 11, and also to power the actuator 35 in its reverse sense. Powering of the actuator 35 in its reverse sense withdraws the rod 44 from the head 10 and shuttle mechanism 38, lifting the head 43 into abutment again with the shoulder 42 so that the shaft 39 is drawn upwardly and lifts the shuttle mechanism 38 and the head 10 until arrested by abutment once again of the stop 48 with the bracket 49. The shuttle mechanism 38 is actuated during the upward movement of the assembly to recharge the head 10 with a pin 1 ready for the next pin-insertion operation.

Referring especially to FIG. 4, the shuttle mechanism 38 includes a slide 57 that is driven transversely of the shaft 39 between forward (as illustrated in FIG. 4) and backward positions by a double-acting pneumatic actuator 58. The slide 57 has a bore 59 that aligns with the rod 44 and the head 10 when the slide 57 is in its forward position and a bore 60 that is correspondingly aligned with them when the slide 57 is in its backward position. While the bore 59 is aligned with the rod 44 and head 10 (as illustrated in FIG. 4), the bore 60 is on the other hand aligned with an inlet passage 61 and receives from this a pin 1 supplied via a tube 62. Thus during the next, backward stroke of the slide 57 the pin loaded in the bore 60 is translated sideways to be brought at the end of the stroke into alignment with the head 10 so that it falls out of the bore 60 clear of the slide 57, onto the ball 51 to recharge the head 10 once again. This backward stroke brings the bore 59 into alignment with an inlet passage 63 to receive a further pin 1 supplied via a tube 64, ready for the next, forward stroke of the slide 57 following insertion of the pin last loaded into the head 10 from the bore 60. This forward stroke will recharge the head 10 with the pin from the bore 59 and again re-load the bore 60 from the passage 61.

Figure 8:
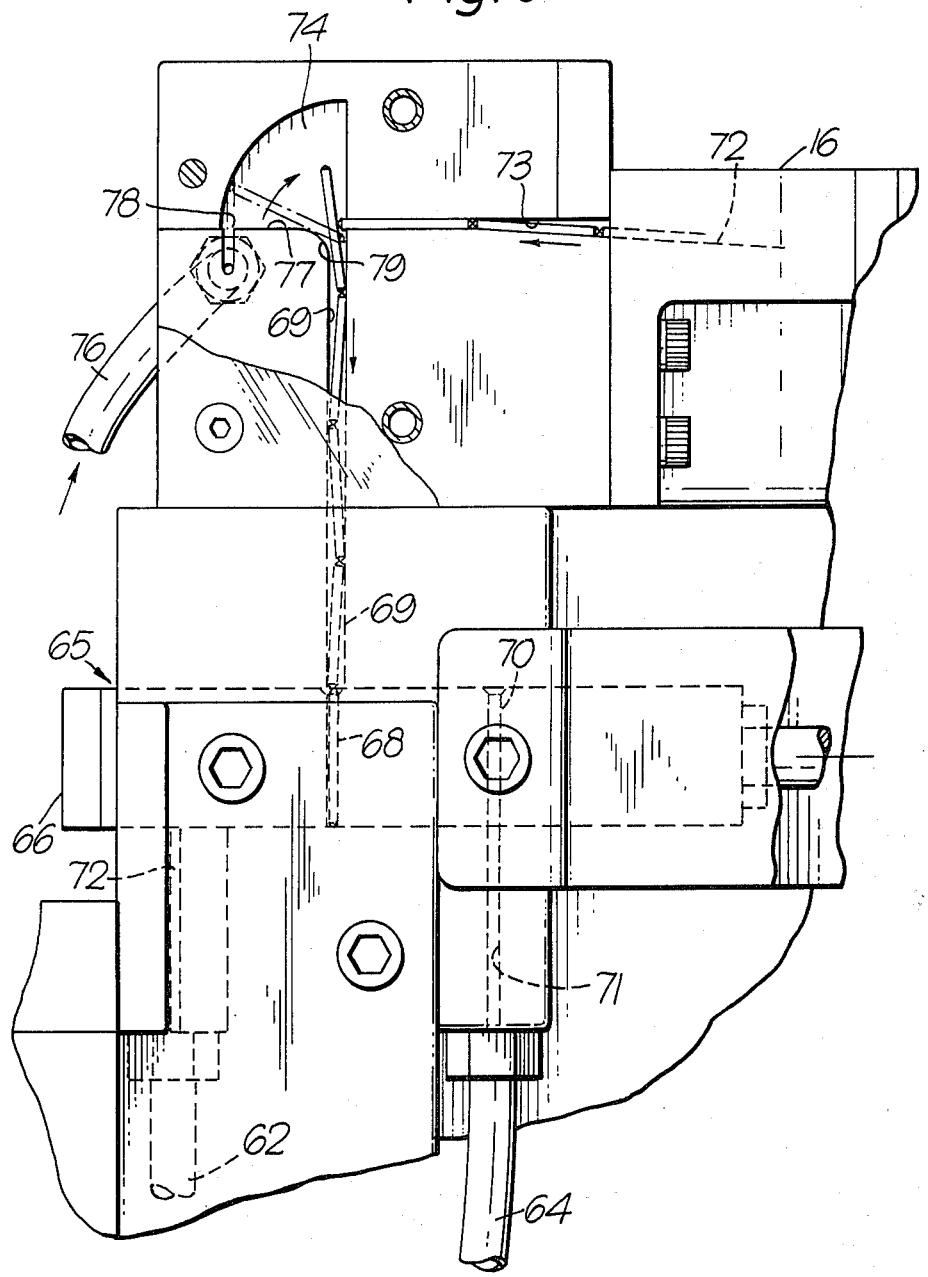
FIG. 8 is an enlarged side view of part of the pin-feed system of the pin-insertion machine.

Pins 1 are supplied one by one into the passages 61 and 63 down the tubes 62 and 64 respectively, from an upper shuttle mechanism 65. The mechanism 65 includes a slide 66 that is driven backwards (as illustrated in FIG. 8) and forwards in synchronism with the forward and backward strokes respectively of the slide 57, by a double-acting pneumatic actuator 67 (FIG. 3). As illustrated in FIG. 8, the slide 66 has a bore 68 that is aligned with a pin-supply passage 69 when the slide 66 is in its backward position, and a bore 70 that is correspondingly aligned with the passage 65 when the slide 66 is in its forward position. When the bore 68 is aligned with the passage 69, the bore 70 is aligned with a passage 71 leading into the tube 64, whereas the bore 68 is aligned with a passage 72 leading into the tube 62 when the bore 70 is aligned with the passage 69. Thus pins 1 received in turn in the bores 68 and 70 from the passage 69 are distributed to the tubes 62 and 64 respectively, upon the successive forward and backward strokes of the slide 66.

The pin-supply passage 69 is maintained full of pins 1 ready to enter the bores 68 and 70 in turn, from the hopper 16. The hopper 16 has an internal helical shoulder 72 (see especially FIG. 3) that rises from within the hopper 16 with progressively-increasing radius to align at the top with a passage 73 that is coupled via a chamber 74 to the passage 69. An electrically-powered vibrator 75 (FIG. 2) vibrates the hopper 16 causing pins 1 loaded into the hopper 16 to align themselves on the shoulder 72 and to rise progressively "nose to tail" up the shoulder 72 and enter the substantially horizontal passage 73. Turning of the into the board 4 according to the pin-insertion program.

The overall rate of pin-insertion programmed is less than the rate of pin feed urged from the vibrating hopper 16. Accordingly there soon becomes an end-to-end build-up of pins 1 in the passages 73 and 69 after commencement of machine operation. This build-up is relieved transitorily only upon each stroke of the shuttle mechanism 65 allowing the lowermost pin in the passage 69 to fall into the bore 68 or 70 as the case may be. Congestion in the chamber 74 is however precluded by the uppermost pin in the passage 69. In this respect the length of the passage 69 is chosen so that a portion (about one-half) of the uppermost pin in the passage 69 remains projecting upwardly into the chamber 74 (as illustrated in FIG. 8). This blocks advance of the next following pin 1 from the passage 73 into the chamber 74. It is only when the next stroke of the shuttle mechanism 65 takes place to admit the lowermost pin 1 in the passage 69 to one or the other of the bores 68 and 70, that the blockage is cleared by fall of the uppermost pin wholly into the passage 69 when the other pins in passage 69 descend. The next following pin 1 is then advanced into the chamber 74 to be tipped up by the air jet from the vent 78 and enter the passage 69 to stand upon its preceding pin, and thereby itself now block pin-entry into the chamber 74 from the passage 73, until the next stroke of the shuttle mechanism 65. The next stroke of the shuttle mechanism 65 takes place in synchronism with that of the shuttle mechanism 38, following insertion of a pin and during re-positioning of the carriage 13 ready for insertion of the next pin from the head 10.

Overall control of the machine in positioning the carriage 13 and inserting pins 1 into the board 4 is effected by the unit 12 in accordance with the programmed instructions of the tape 17. The construction of the unit 12, together with its interconnection with other components of the machine, is illustrated schematically in FIG. 9; the unit 12 and its operation will now be described with reference to that figure.

Referring to FIG. 9, instructions on the tape 17 are read in turn within the unit 12 by a tape-read unit 80 and are signalled electrically to a decode-and-store unit 81. Each instruction includes identification of the X- and Y-coordinate values, Xd and Yd, of a demanded position of the head 10, together with an operation command appropriate to that demanded position. Electric signals in accordance with the values Xd and Yd are supplied respectively to an X-comparator unit 82 and a Y-comparator unit 83 for comparison with the actual X and Y coordinate values, Xa and Ya, that relate the position of the carriage 13 to the head 10. These values Xa and Ya are signalled to the units 82 and 83 respectively from buffer stores 84 and 85 that receive the outputs of the photoelectric readers 30 and 31.

Figure 10:
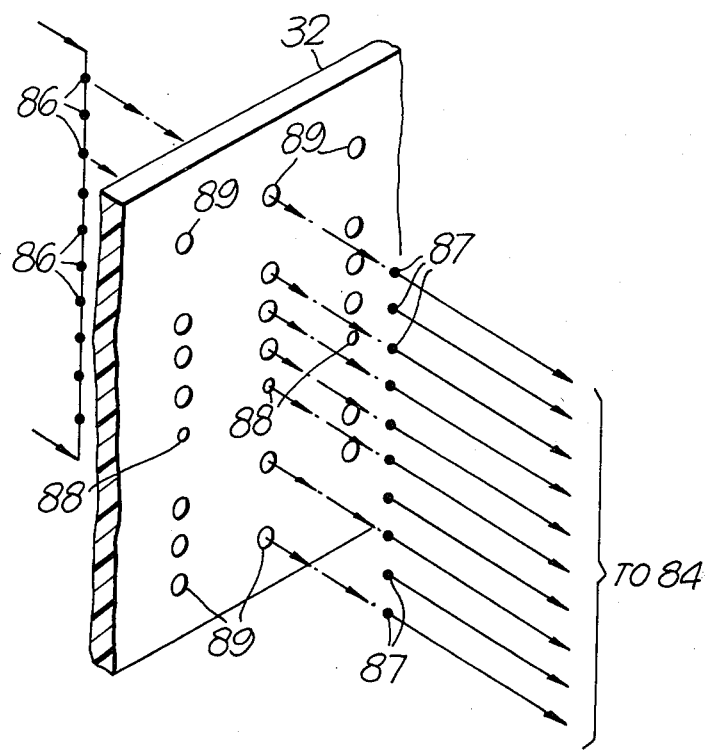
FIG. 10 illustrates the construction of a photoelectric reader of the pin-insertion machine.

The photoelectric reader 30, as illustrated in FIG. 10 (and similarly the photoelectric reader 31), includes a column of ten light-emitting diodes 86 located on one side of the code-plate 32 and a parallel column of ten photo-responsive diodes 87 located on the other side. The diodes 86 emit infra-red light towards the code-plate 32, and each diode 87 provides an output signal in dependence upon whether light is received through the code-plate 32 from a respective one of the diodes 86. Each diode 87 accordingly provides an output in dependence upon whether it is in register with a hole in the code-plate 32 (or code-plate 33). The code-plate 32 (and similarly the code-plate 33) has a regular series of small holes 88 running throughout its coded length so as to define a multiplicity of discrete code positions separated from one another by increments of 0.1 inch (2.5 mm). Up to nine larger-diameter holes 89 are distributed across the width of the plate at each code position to provide a combination of holes characteristic by their number and distribution of that position. Accordingly the diodes 87 of the reader 30, acting in conjunction with the code-plate 32, provide a combination of outputs to the buffer store 84 characteristic of the value of Xa. The ten photo-responsive diodes of the reader 31 acting in conjunction with the code-plate 33, correspondingly provide a combination of outputs to the buffer store 85 characteristic of the value Ya.

The values of Xa and Ya signalled to the buffer stores 84 and 85 are entered into those stores under control of pulses supplied by strobe units 90 and 91 driven from the motors 20 and 21. Each unit 90 and 91 includes a diode 92 associated with a slotted disc 93 that is rotated by the relevant motor 20 or 21 to bring one or the other of two diametrically-opposed narrow slots 94 of the disc 93 into alignment with the diode 92 for each code-position increment in the respective X- and Y-coordinate. Light from a source 95 on the opposite side of the disc 93 passes to the diode 92 whenever one of the slots 94 comes into alignment with the diode 92, so that a succession of pulses related accurately to the achievement of successive increments of movement, are derived. The pulses supplied from the diode 92 of the unit 90 serve to effect change in the indication of the value Xa stored and signalled by the buffer store 84, whereas the pulses supplied from the diode 92 of the unit 91 serve to effect change in the value of Ya stored and signalled by the buffer store 85.

The values of Xa and Ya signalled from the buffer stores 84 and 85 are compared with the values Xd and Yd respectively, in the units 82 and 83, to determine the magnitude and sense of the corrections in the values Xa and Ya required to bring the carriage 13 to the demanded position. The correction in the value of Xa is signalled from the unit 82 to a unit 96 that controls energization of the motor 20 to drive the lead-screw 22 of the X-slide 14 via a gearbox 97. The correction in the value Ya is on the other hand signalled from the unit 83 to a unit 98 that controls energization of the motor 21 to drive the lead-screw 23 of the Y-slide 15 via a gearbox 99. The motor-control units 95 and 97 energize the respective motors 20 and 21 with pulses, such pulses being supplied at a frequency and in a sense dependent upon the magnitude and sense of the relevant correction required.

The motors 20 and 21 continue to be energized from the units 96 and 98 until the values of Xa and Ya have been brought to equality with the demanded values Xd and Yd, that is to say, until the carriage 13 is located beneath the head 10 in accordance with the relevant instruction read from the tape 17. The condition in which there is equality between the values of Xa and Xd is detected by the comparator unit 82 and is signalled thereby to a function-control unit 100, whereas the condition in which there is equality between Ya and Yd is detected and signalled to the unit 100 by the comparator unit 83. The unit 100 receives from the decode-and-store unit 81 a signal in accordance with the operation command of the instruction read from the tape 17, and responds to receipt of both equality-indicating signals from the units 82 and 83, to act on the relevant command. The command will in general instruct insertion of a pin, and in this event the unit 100 issues the appropriate command signal to the pneumatic control unit 34 required to initiate the pin-insertion sequence. Insertion of the pin in accordance with the command is signalled back to the unit 100 from the microswitch 54, and the unit 100 in response to this signals the tape-read unit 80 to advance the tape 17 to read out the next programmed instruction.

The instructions read from the tape 17 may include so-called 'jump' operation-commands, such commands being utilized where it is necessary for movement of the carriage 13 from one position of pin insertion to the next to be other than along a direct path. For example, where certain components or other items are already mounted on the board before pin insertion, it may be necessary to ensure that such items are not moved beneath or too close to the head 10; the programming of carriage-movement for this can be achieved by using a series of step-movements in different directions. The step-movements are programmed on the tape 17 in terms of the X- and Y-coordinates of the way-points at which direction change is required, but in this case the operation command included in each instruction is a 'jump' command distinct from the pin-insertion command. When a signal in accordance with a 'jump' command is supplied from the unit 81 to the unit 100 in respect of an instruction from the tape 17, the unit 100 responds to the two equality-signals supplied from the comparator units 82 and 83 to signal the tape-read unit 80 to advance the tape 17 to the next instruction, without issuing a command signal to the pneumatic control unit 34.

To the extent that control of the machine has so far been described it is effective to move the carriage 13 and accurately locate it with respect to the head 10 in code-defined positions spaced from one another by increments of 0.1 inch (2.5 mm). Where intermediate locations are required these are achieved to an accuracy of 0.001 inch (0.025 mm) by including additional digits of lesser or 'fine' significance in the values of Xd and Yd programmed on the tape 17. Positioning of the carriage 13 to the nearest X and Y code positions is carried out as described above, in accordance with the most-significant digits of the values of Xd and Yd, to obtain coarse positioning. Once this has been achieved the units 82 and 83 then act to supply individual pulses to the motors 20 and 21 respectively, via the motor control units 96 and 98, in accordance with the 'fine' digits of Xd and Yd. These pulses serve to step the motors 20 and 21 on the appropriate number of steps to achieve the required intermediate positioning.

We claim:

1. In a method for inserting components into a board, in which a component-insertion head and the board are brought into contact one with the other where a said component is to be inserted, and including repeated execution of steps which comprise a first step of charging the head with a component via a reciprocated shuttle and a second step of driving the component from the head into the board, said first step including loading a component on the shuttle when the reciprocated shuttle is at the end of a first of the two strokes of its reciprocating movement and through the second of said strokes of the reciprocated shuttle translating this component as so loaded on the shuttle to said head to charge said head therewith, the improvement wherein said first step also includes loading a component on the shuttle when the shuttle is at the end of its said second stroke and through the said first stroke of the reciprocated shuttle translating this component as so loaded on the shuttle to said head to charge said head therewith, the shuttle being reciprocated to execute its said first and second strokes in response to successive executions respectively of said second step.

2. The method of claim 1 in which the board is moved relative to said component-insertion head to locate the head successively at different positions of the board, and the head is operated to insert individual ones of said components into the board at a multiplicity of said positions, said board being moved automatically relative to the head from one said position to the next in accordance with execution of an ordered sequence of instructions, each said instruction including coordinates of demanded board-position with respect to the head and an operation command, and wherein the method includes in respect of execution of each of at least some of said instructions of the sequence the steps of determining coordinates of the actual position of the board with respect to the head, comparing the coordinates of actual position and of demanded position with one another to determine the difference therebetween, moving the board to reduce the said difference towards zero, responding to the operation command when the said difference has been reduced to zero to operate said head to insert a component into the board, and responding to insertion of a component into the board to proceed to execution of the next instruction of the sequence.

3. A method according to claim 2 wherein some of the instructions include a jump operation-command, the method including in respect of each such instruction the steps of determining coordinates of the actual position of the borad with respect to the head, comparing the coordinates of actual position and of demanded position with one another to determine the difference therebetween, moving the board to reduce the said difference to zero, responding to the jump operation-command when the said difference has been reduced to zero to proceed to execution of the next instruction of the sequence without operation of said head.

4. In a machine for inserting pins into a board, said machine including a pin-insertion head, a reciprocating shuttle having a pin-receiving aperture therein for translating pins loaded in said aperture to the said head one at a time, pin-loading means operative when the shuttle is in a first position to load a pin into said aperture of the shuttle, the shuttle being moved in one stroke of its reciprocating movement by a predetermined distance from the said first position to occupy a second position in which said aperture is aligned with the said head so as to translate the loaded pin to the said head for insertion therefrom into said board, and said shuttle being moved in a return stroke of its reciprocating movement back to its said first position for reloading from the said pin-loading means with another of said pins, the improvement wherein the shuttle has a further pin-receiving aperture therein spaced from the first-mentioned aperture by an amount measured in the direction of said first hole equal to said distance, and wherein the machine includes further pin-loading means spaced effectively from the first-mentioned pin-loading means by an amount in said direction equal to twice said distance, said further pin-loading means being operative when the shuttle is in its said second position to load the shuttle with a pin for translation to the said head during the said return stroke of the shuttle so that an individual pin is translated to the said head for insertion therefrom into the board upon each stroke of the shuttle.

5. The machine of claim 3 which further includes, a carrier for the board, said carrier being moveable relative to said pin-insertion head to locate the head successively at different positions of the board and said head being selectively operable for inserting an individual one of said pins into the board at each such position, and automatic control means for moving the carrier means and operating the head in accordance with an ordered sequence of instructions, each said instruction including coordinates of demanded board-position with respect to the head and an operation command with command, at least in some instructions, is a pin-insertion command, and wherein the control means comprises signal-supply means for supplying signal representations of the coordinates of demanded board-position and the operation command of a selected one of said instructions, the signal-supply means being actuable to advance from one to the next in said sequence the particular one of the instructions selected, means for supplying signal representations to the coordinates of the actual position with respect to the head of the board as carried by the carrier means, means for comparing with one another the signal representations of the coordinates of actual and demanded positions to determine the difference therebetween, means for moving the carrier means to reduce the said difference towards zero, means for responding to signal representation of a pin-insertion command to operate said head to insert a pin into the board when the said difference has been reduced to zero, and means responsive to insertion of a pin into the board to actuate said signal-supply means to advance its selection to the next instruction of the sequence.

6. A machine according to claim 5 wherein said carrier means is mounted for movement in each of two mutually-perpendicular coordinate directions, and said means for supplying signal representations of the coordinates of the actual position of the board comprises in respect of each coordinate direction, coding means for providing digital representation of the displacement of the carrier means in that coordinate direction, means to generate a strobe signal in response to successive unit-distance increments of movement of the carrier means in said coordinate direction, and storage means responsive to the strobe signal to store the digital representation then being generated by said code means, and means to generate signals in accordance with said digital representation stored by said storage means.

7. A machine according to claim 4 including a second shuttle for supplying pins in turn to the two pin-loading means, and means for reciprocating the said second shuttle in synchronism with the first-mentioned shuttle.

8. A machine for inserting terminal pins into a printed-circuit board, comprising a pin-insertion head that is chargeable with said pins for insertion into the board, shuttle means for charging said head with pins, said shuttle means including a shuttle mounted for reciprocal movement between first and second positions with respect to said head and having first and second pin-receiving passages spaced apart from one another, pin-feed means for loading pins individually into said first and second passages when the shuttle is in its said first and second positions respectively, said first and second pin-receiving passages being spaced from one another to align the said first passage with the said head when the shuttle is in its said second position and to align the said second passage with the said head when the shuttle is in its said first position, said shuttle means being operative when the said shuttle is in either of its said first and second positions to charge said head with a pin from whichever of the said first and second pin-receiving passages is at that time aligned with the said head, means operative to drive the pin from the head into the board, and means responsive to each operation of said pin-drive means to move the shuttle between its said first and second positions, the shuttle being moved in opposite directions between the said first and second positions in response to successive operations of said pin-drive means so as to charge the said head from the said first and second pin-receiving passages in turn.

9. A machine according to claim 8 wherein said pin-feed means comprises first and second pin-conveying passages for conveying individual pins to the said first and second pin-receiving passages of said head-charging shuttle when the shuttle is in its said first and second positions respectively, a pin-supply passage, means for supplying pins to said pin-supply passage, a pin-distributing shuttle mounted for reciprocal movement between first and second positions with respect to said pin-supply passage, said pin-distributing shuttle having first and second pin-receiving passages spaced apart from one another to receive individual pins from said pin-supply passage when that shuttle is in its said second and first positions respectively, and means for reciprocating said pin-distributing shuttle between its said first and second positions, movement of said pin-distributing shuttle from its said first position to its said second position translating the pin received by said second pin-receiving passage to enter said second pin-conveying passage and movement of said pin-distributing shuttle from its said second position to its said first position translating the pin received by said first pin-receiving passage to enter said second pin-conveying passage.

10. A machine according to claim 9 wherein said means for reciprocating said pin-distributing shuttle is means to reciprocate that shuttle in synchronism with said head-charging shuttle so as to move said pin-distributing shuttle in the direction from its said first to second position when movement of the said head-charging shuttle is in the direction from its said second to first position.

11. A machine according to claim 10 wherein said means for supplying pins to said pin-supply passage comprises a chamber having a base wall, means for supplying pins nose-to-tail to enter said chamber at one end of the base wall and slide therealong, said base wall having an opening therethrough at said one end communicating with said pin-supply passage, and means operative at a position along the base wall spaced from said one end to lift the leading end of each pin entered into the chamber so that its trailing end enters said opening, whereby the lifted pin blocks progress into the chamber of the next following pin supplied thereto until the lifted pin has passed fully from said chamber.

12. A pin-insertion machine comprising a pin-insertion head, pin-feed means for supplying pins in turn to the head, and means operable to drive the pin from the head for insertion therefrom, said pin-feed means including a chamber for turning the pins through a substantial angle, a first pin-feed passage opening into the chamber, means for supplying pins to the said first passage to pass therealong in nose-to-tail sequence for entry into the said chamber in turn, the said chamber having a base wall substantially aligned with said first passage so that each pin entering the said chamber from the said first passage slides along the base wall with the leading end of the pin moving progressively further into the chamber from the said first passage, means operative to lift the leading end of the pin up from the base wall when the trailing end of the pin has entered the said chamber, and a second pin-feed passage opening from said chamber for feeding pins nose-to-tail therefrom, said second passage opening through the said base wall to receive the said trailing end of the lifted pin so that this pin enters the said second passage to pass fully into that passage from the said chamber, the opening of the said second passage from the said chamber being located adjacent the opening of the said first passage into the said chamber so that progress into the said chamber of the pin which in said sequence follows immediately behind the lifted pin, is blocked by the lifted pin until the lifted pin has passed fully from said chamber.

13. A pin-insertion machine according to claim 12 wherein said means for lifting the leading end of the pin comprises an air-supply passage that opens into the chamber through a vent in said base wall, said vent being spaced along said wall from the opening from that wall of said second passage, and means for supplying air under pressure to the air-supply passage so that when the leading end of the pin reaches the vent it is lifted up from the said wall by the air issuing from the vent.

* * * * *